United States Patent
Nagaya et al.

(10) Patent No.: US 6,278,225 B1
(45) Date of Patent: Aug. 21, 2001

(54) PIEZOELECTRIC CERAMIC COMPOSITION FOR USE IN AN ULTRASONIC WAVE MOTOR

(75) Inventors: Toshiatsu Nagaya; Hirokatsu Mukai, both of Kuwana; Takashi Yamamoto, Chiryu; Hiroaki Makino; Nobuo Kamiya, both of Aichi, all of (JP)

(73) Assignee: Denso Corporation (JP)

(*) Notice: Subject to any disclaimer, the term of this patent is extended or adjusted under 35 U.S.C. 154(b) by 0 days.

(21) Appl. No.: 09/627,330

(22) Filed: Jul. 27, 2000

Related U.S. Application Data

(62) Division of application No. 09/195,228, filed on Nov. 18, 1998, now abandoned.

(30) Foreign Application Priority Data

Nov. 18, 1997 (JP) .................................... 9-335129
Oct. 22, 1998 (JP) .................................. 10-300773

(51) Int. Cl.$^7$ ................................................ H01L 41/187
(52) U.S. Cl. ................................................................ 310/358
(58) Field of Search .............................................. 310/358

(56) References Cited

U.S. PATENT DOCUMENTS 4,751,209 * 6/1988 Yokotani et al. ..................... 501/138

FOREIGN PATENT DOCUMENTS

| 40 41 993 A1 | * 7/1992 | (DE) | ................................... 310/358 |
| 43 27 993 C 1 | * 11/1994 | (DE) | ................................... 310/358 |
| 39-6277 | 5/1964 | (JP) | . |
| 1-111725 | 4/1989 | (JP) | ............................... C01G/25/00 |
| 8-119733 | * 7/1992 | (JP) | ................................... 310/358 |
| 8-119733 | 5/1996 | (JP) | ............................... C04B/35/49 |
| 8-325058 | 12/1996 | (JP) | ............................... C04B/35/49 |
| 11-191968 | 7/1999 | (JP) | ............................... H02N/2/00 |

* cited by examiner

Primary Examiner—Thomas M. Dougherty
(74) Attorney, Agent, or Firm—Pillsbury Winthrop LLP

(57) ABSTRACT

A piezoelectric ceramic composition, having a tetragonal perovskite structure and represented by a general formula $Pb_aSr_b(Zr_cTi_dSb_eMn_f)O_3$ wherein Pb and Sr are assumed to occupy A site, Zr, Ti, Sb and Mn are assumed to occupy B site, and a molar ratio of A site/B site atoms of $(a+b)/(c+d+e+f)$ is more than 1.00 to 1.03, preferably 0.01 to 0.03.

12 Claims, 2 Drawing Sheets

PIEZOELECTRIC CERAMIC COMPOSITION FOR USE IN AN ULTRASONIC WAVE MOTOR

This application is a Divisional of Ser. No. 09/195,228 filed Nov. 18, 1998 now abandoned.

BACKGROUND OF THE INVENTION

1. Field of the Invention

The present invention relates to a piezoelectric ceramic composition for use in an ultrasonic wave motor, a piezoelectric transducer, etc.

2. Description of Related Art

As piezoelectric ceramic compositions used for an ultrasonic wave motor, an ultrasonic oscillator, a piezoelectric transducer, an igniter and the like, compositions comprised mainly of lead titanate zirconcite, as disclosed in Japanese Examined Patent Publication (Kokoku) No. 39-6277 and Japanese Unexamined Patent Publication (Kokai) No. 8-119733, for example, are known.

Japanese Examined Patent Publication (Kokoku) No. 39-6277 discloses a composition in which $Sb_2O_3$ and $MnO_2$ are externally added to a stoichiometric lead titanate zirconate represented by $Pb(Zr_xTi_y)O_3$ where $x+y=1$ and Sr partially substitutes for Pb.

Japanese Unexamined Patent Publication (Kokai) No. 8-119733 discloses a composition of $Pb((Mn_{1/3}Sb_{2/3})_x Zr_yTi_z)O_3$ where $x+y+z=1$, Sr partially substitutes for Pb, and the total mole of Sr and Pb is less than 1.

It is known that these compositions provide an excellent initial electric property when they are applied to a ultrasonic wave motor, etc.

However, the above known piezoelectric ceramic compositions have the following problems.

The piezoelectric ceramic compositions, although they have an excellent initial electric property, have a low fatigue resistance and therefore lack reliability. The reason therefor is thought to be that since a temperature of about 1200° C. or higher is required to sinter the above known piezoelectric ceramic compositions for densification, the crystal grain size of the sintered body becomes relatively large and a microstructure, including fine $ZrO_2$ particles deposited in grain boundaries, is formed. Also, stable commercial manufacture of the piezoelectric ceramic compositions is not easy due to a high sintering temperature, resulting in non-uniform quality of the products.

Thus, development of a piezoelectric ceramic composition which has an excellent electric property and excellent reliability and can be easily manufactured, has been demanded.

The present invention responds to the above demand and aims to provide a piezoelectric ceramic composition which can be manufactured at a temperature lower than the conventional temperature, has a small crystal grain size and is excellent in fatigue resistance.

SUMMARY OF THE INVENTION

The present invention attains the above object by providing a piezoelectric ceramic composition, having a tetragonal perovskite structure and represented by a general formula $(Pb_aSr_b)(Zr_cTi_dSb_eMn_f)O_3$ wherein Pb and Sr are assumed to occupy an A site, Zr, Ti, Sb and Mn are assumed to occupy a B site, and a molar ratio M of A site/B site atoms of $(a+b)/(c+d+e+f)$ is in a range of more than 1.00 to 1.03 (1.00<M23 1.03), preferably in a range of 1.01 to 1.03 (1.01≦M≦1.03).

In a preferred embodiment, the piezoelectric ceramic composition of the present invention has an average crystal particle size of 1 to 3 μm and an average flexural strength of not less than 100 MPa.

In another preferred embodiment, the piezoelectric ceramic composition of the present invention has a piezoelectric constant $-d_{31}$ of not less than 140 pm/V and a mechanical quality $Q_m$ of not less than 500.

DETAILED DESCRIPTION OF THE INVENTION

Figure 1:
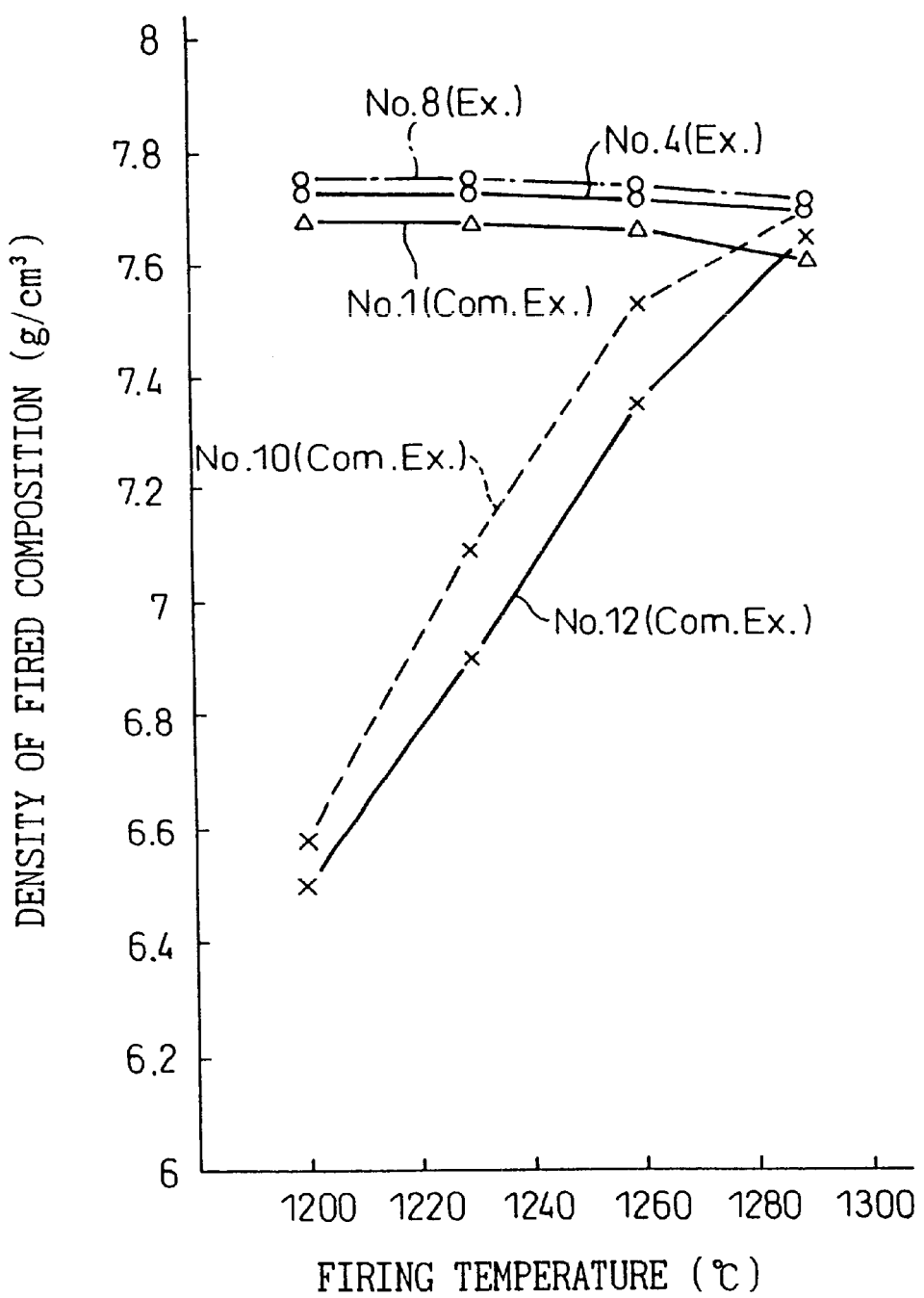
FIG. 1 is a graph showing the relationship between the sintering temperature and the density of the fired piezoelectric ceramic compositions in Example 1.

The characteristic feature of the present invention resides in that the piezoelectric ceramic composition has a tetragonal perovskite structure (crystal system), typically represented by compositional formula $ABO_3$, and a molar ratio between the A site to B site atoms of the perovskite structure represented by the above general formula $(Pb_aSr_b)(Zr_cTi_dSb_eMn_f)O_3$ is within the above specific range.

The A and B sites here define certain positions of the perovskite structure which are occupied by certain atoms. In the present invention, the A site is defined as the position occupied by Pb and Sr and the B site is defined as the position occupied by Zr, Ti, Mn and Sb.

In the theoretical perovskite structure, the A site eltom, the B site atom and oxygen atom present in a molar ratio of 1:1:3. In the piezoelectric ceramic composition of the present invention, each of the A site atoms, the B site atoms and oxygen present in amount very close to the corresponding amount of the theoretical perovskite.

The molar ratio of the A site to B site atoms of $(a+b)/(c+d+e+f)$ in the present invention however must be in a range of from more than 1.00 to 1.03. If this molar ration is not more than 1.00, the B site atoms are present in an amount equal to or in excess of the amount of the A site atoms, causing deposition of fine $ZrO_2$ particles in grain boundaries and requiring a high sintering temperature as in the conventional art. Therefore, the molar ratio of not less than 1.00 is preferable. If the molar ratio is more than 1.03, Pb is in excess causing excessive initial sintering in a firing step to impair densification of the fired body.

It is noted that the values of a to f in the above general formula are the ratios of respective atoms when $c+d+e+f=1$ is assumed.

It is preferred that $c+d≧0.92$, $0.45≦c≦0.55$, and $0.45≦d≦0.55$. This allows the Zr/Ti ratio to be limited to within an optimum range by which the electric property of the piezoelectric ceramic composition can be maintained. If any of the above three ranges is not satisfied, the Zr/Ti ratio is outside the optimum range and the electric property of the piezoelectric ceramic composition is deteriorated.

It is preferred that $0.005≦e≦0.05$. If e is less than 0.005 or more than 0.05, the piezoelectric constant $-d_{31}$ is lowered.

It is preferred that $0.005≦f≦0.03$. If f is less than 0.005, the mechanical quality factor $Q_m$ is lowered. If f is more than 0.03, the piezoelectric constant $-d_{31}$ is lowered.

It is preferred that $b \leq 0.1$. If b is more than 0.1, the Curie temperature is lowered and the temperature of use is undesirably lowered. The lower limit of b is preferably more than 0.03 to prevent the piezoelectric constant $-d_{31}$ from falling.

The piezoelectric ceramic composition of the present invention has a tetragonal perovskite structure and is represented by a general formula $(Pb_aSr_b)(Zr_cTi_dSb_eMn_f)O_3$ wherein Pb and Sr are assumed to occupy the A site, Zr, Ti, Sb and Mn are assumed to occupy the B site, and a molar ratio of A site/B site atoms of $(a+b)/(c+d+e+f)$ is limited to a range of more than 1.00 to 1.03. As a result, the piezoelectric ceramic composition of the present invention can be densely sintered at a temperature lower than the conventional temperature and deposition of $ZrO_2$ fine particles in grain boundaries is prevented.

The reasons thereof may be as follow:

In the present invention, since the ratio of the A to B site atoms is limited to more than 1.00, the B site atoms are never present in excess of the A site atoms. This prevents excess presence of Zr during the firing step and therefore prevents deposition of $ZrO_2$ fine particles in grain boundaries.

Deposition of $ZrO_2$ fine particles in grain boundaries was a factor impairing sintering in the conventional technique. By preventing deposition of $ZrO_2$ fine particles in grain boundaries, the sintering of the composition of the present invention can be conducted at a temperature lower than the conventional temperature.

When the molar ratio of the A site to B site atoms of the conventional piezoelectric ceramic compositions is considered from the viewpoint of the present invention, the B site atoms are present in excess compared to the A site atoms. Therefore, it is believed that in the conventional piezoelectric ceramic compositions, Zr is in excess which accelerates formation of $ZrO_2$ and results in the various disadvantages as described before.

Thus, in the present invention, the piezoelectric ceramic composition can be sintered at a temperature lower than the conventional temperature and deposition of $ZrO_2$ in grain boundaries can be prevented. As a result, the crystal grain size of the sintered body can be reduced due to a lower firing temperature and the fatigue resistance can be improved. Therefore, the piezoelectric ceramic composition of the present invention has a reliability higher than conventional compositions. Further, the lower firing temperature allows improvement in productivity.

As above, in accordance with the present invention, a piezoelectric ceramic composition which can be produced at a temperature lower than the conventional temperature and have a smaller crystal grain size and a more excellent fatigue resistance than the conventional values, can be provided.

Moreover, it is preferred in the present invention that the piezoelectric ceramic composition has an average crystal grain size of 1 to 3 $\mu m$ and an average flexural strength of not less than 100 MPa. If the average crystal grain size is less than 1 $\mu m$, the piezoelectric constant of the composition is lowered. If the average crystal particle size is more than 3 $\mu m$, the strength $-d_{31}$ of the piezoelectric ceramic composition is lowered. By making the average flexural strength less than 100 MPa, a piezoelectric ceramic composition suitable for a ultrasonic wave motor, for example, can be obtained.

It is also preferred that the piezoelectric ceramic composition has a piezoelectric constant $-d_{31}$ of not less than 140 pm/V and a mechanical quality factor $Q_m$ of not less than 500.

The piezoelectric constant $-d_{31}$ and the mechanical quality factor $Q_m$ are calculated by the following formulae (1) and (2). In the formula (1), $k_r$, $E_{33}^T$, and $S_{11}^E$ are represented by the following formulae (1), (4) and (5).

$$\text{Piezoelectric constant } -d_{31}, \text{pm/V}, = k_r[((1-\sigma)/2) \cdot E_{33}^T \cdot S_{11}^E]^{1/2} \quad (1)$$

$$\text{Mechanical quality factor } Q_m = 1/[2\pi \cdot f_r \cdot Z_r \cdot C(1-(f_r/f_a)^2)] \quad (2)$$

$$1/k_r^2 = 0.395 f_r/(f_a-f_r) + 0.574 \quad (3)$$

$$E_{33}^T, F/m, = C \cdot t/S \quad (4)$$

$$1/S_{11}^E, m^2/N, = \rho[2\pi(1-\sigma^2)^{1/2}/\eta) \cdot r \cdot f_r]^2 \quad (5)$$

where $\sigma=0.30$ and $\eta=2.05$; t stands for the thickness of the sample in terms of m (meter); S stands for the area of the end surface of the sample in terms of $m^2$; C stands for the static capacity measured at 1 kHz by LCR meter (YHP-4194A) in terms of F; $\rho$ is the density in terms of $g/cm^3$; $f_a$ and $f_r$ stand for the anti-resonance and resonance frequencies, respectively, in terms of Hz; and $Z_r$ stands for the resonance impedance, all of which are measured in accordance with known methods.

If the piezoelectric constant $-d_{31}$ obtained by the above formula (1) is less than 140 pm/V, the motor torque is lowered when the composition is applied to a ultrasonic wave motor.

If the mechanical quality factor $Q_m$ obtained by the above formula (2) is less than 500, the rotation number (per unit time) is lowered when the composition is applied to a ultrasonic wave motor.

EXAMPLES

Example 1

Figure 2:
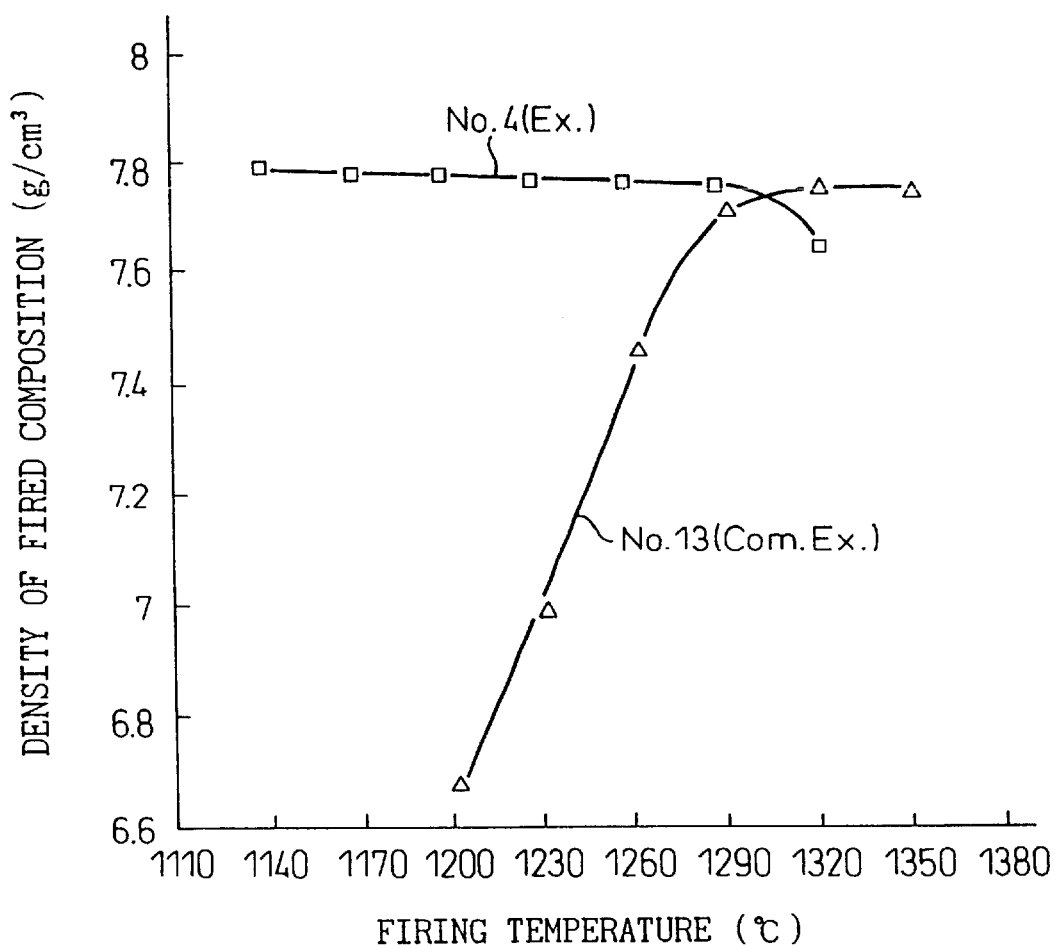
FIG. 2 is another graph showing the relationship between the sintering temperature and the density of the fired piezoelectric ceramic compositions in Example 1.

FIGS. 1 and 2 are referred to.

In this Example, piezoelectric ceramic compositions, having a tetragonal perovskite structure and represented by a general formula $Pb_aSr_b(Zr_cTi_dSb_eMn_f)O_3$ wherein Pb and Sr are assumed to occupy the A site Zr, Ti, Sb and Mn are assumed to occupy the B site, and a molar ratio of A site/B site atoms of $(a+b)/(c+d+e+f)$ is more than 1.00 to 1.03, were produced. The properties of the manufactured piezoelectric ceramic compositions as well as comparative samples which also were produced were evaluated.

The piezoelectric ceramic compositions were produced in the following manner.

As the starting materials, lead oxide PbO, strontium carbonate $SrCO_3$, titanium oxide $TiO_2$, zirconium oxide $ZrO_2$, antimony oxide $Sb_2O_3$ and manganese carbonate $MnCO_3$ were prepared and weighed to obtain $Pb_aSr_b$ $(Zr_cTi_dSb_eMn_f)O_3$ with the desired values of a to f as shown in Table 1.

The above starting materials were added with water as a medium, which was then mixed in a ball mill for 20 hours. The resulting mixture was dried at 140° C. for 48 hours and kneaded and then calcinated at 850° C. for 2 hours, which was comminuted in a ball mill for 48 hours.

The obtained slurry was added with 0.5% of polyvinyl alcohol (PVA) as a binder and made into granules with a spray dryer. The granules were molded at a pressure of 100 MPa to form a shaped body having a diameter of 24.5 mm and a thickness of 2 mm.

The shaped body was heated in the air at 700° C. for 2 hours to remove the binder resin and packed and sealed in an alumina container, which was then fired in the air at a temperature ranging from 1140° C. to 1350° C. for 2 hours.

The obtained sintered body was lapped to a thickness of 1 mm. On both lapped surfaces of the sintered body, an Ag electrode was formed. The sintered body was ground to a diameter of 16 mm.

The sintered body thus machined was immersed in a silicon oil and a direct electric voltage was applied thereto at 2 kv/mm for 20 minutes for polarization treatment.

Thus, various piezoelectric ceramic compositions were obtained. The concrete chemical compositions of respective piezoelectric ceramic compositions are shown in Table 1 using the values of a to f. Sample Nos. 3, 4 and 6 to 9 in Table 1 are the thus produced working examples of the present invention.

Also, comparative samples were produced in similar manners but the chemical compositions thereof were different. The concrete chemical compositions of such, comparative samples are shown in Table 1 using the values of a to f. They are Sample Nos. 1, 2, 5 and 10 to 15 in Table 1.

To evaluate the piezoelectric ceramic compositions of this Example 1, the average crystal grain size, piezoelectric constant and crystal structure of the piezoelectric ceramic compositions were measured for the compositions produced in accordance with the above described method provided that the firing was made at 1290° C. for 2 hours. The results are shown in Table 1.

were satisfactorily densified by firing at 1200° C., but Sample Nos. 10 and 12 where (a+b)/(c+d+e+f) was not more than 1 could be satisfactorily densified only by raising the firing temperature to 1290° C. However, the Sample No. 1 in which (a+b)/(c+d+e+f) was 1.04, exhibited a reached density which was relatively low. Therefore, it is found that the ratio of (a+b)/(c+d+e+f) should be less than 1.04.

FIG. 2 shows that Sample No. 4 of the percent invention was satisfactorily densified by firing at a low temperature of 1140° C. or lower, but the density of the comparative Sample No. 13 was very low when fired at a temperature ranging from 1140° to 1200° C.

Example 2

The same composition as that of Sample No. 4 in Table 1 was prepared and made into granules in the same manner as in Example 1.

The granules was molded at a pressure of 100 MPa to form a shaped body having an outer diameter of 80 mm, an inner diameter of 50 mm and a thickness of 20 mm.

The shaped body was heated in the air at 700° C. to remove the binder resin which was then packed and sealed in an alumina container and fired at 1200° C. for 2 hours.

TABLE 1

| Sample No. | a | b | c | d | e | f | (a + b)/(c + d + e + f) | Average crystal grain size ($\mu$m) | $-d_{31}$ (pm/V) | Crystal system |
|---|---|---|---|---|---|---|---|---|---|---|
| No. 1  | 0.99 | 0.05 | 0.48  | 0.48  | 0.03 | 0.01 | 1.04 | 2.2 | 147 | Tetragonal |
| No. 2  | 0.99 | 0.05 | 0.47  | 0.49  | 0.03 | 0.01 | 1.04 | 2.2 | 120 | Trigonal |
| No. 3  | 0.98 | 0.05 | 0.48  | 0.48  | 0.03 | 0.01 | 1.03 | 2.3 | 150 | Tetragonal |
| No. 4  | 0.97 | 0.05 | 0.48  | 0.48  | 0.03 | 0.01 | 1.02 | 2.4 | 153 | Tetragonal |
| No. 5  | 0.97 | 0.05 | 0.49  | 0.47  | 0.03 | 0.01 | 1.02 | 2.5 | 137 | Trigonal |
| No. 6  | 0.97 | 0.05 | 0.475 | 0.475 | 0.03 | 0.02 | 1.02 | 2.5 | 160 | Tetragonal |
| No. 7  | 0.97 | 0.05 | 0.49  | 0.46  | 0.03 | 0.02 | 1.02 | 2.5 | 155 | Tetragonal |
| No. 8  | 0.96 | 0.05 | 0.48  | 0.48  | 0.03 | 0.01 | 1.01 | 2.6 | 154 | Tetragonal |
| No. 9  | 0.96 | 0.05 | 0.49  | 0.47  | 0.03 | 0.01 | 1.01 | 2.6 | 162 | Tetragonal |
| No. 10 | 0.94 | 0.05 | 0.48  | 0.48  | 0.03 | 0.01 | 0.99 | 2.5 | 133 | Tetragonal |
| No. 11 | 0.93 | 0.05 | 0.49  | 0.47  | 0.03 | 0.01 | 0.98 | 3.1 | 180 | Tetragonal |
| No. 12 | 0.91 | 0.05 | 0.48  | 0.48  | 0.03 | 0.01 | 0.96 | 3.6 | 111 | Tetragonal |
| No. 13 | 0.91 | 0.05 | 0.49  | 0.47  | 0.03 | 0.01 | 0.96 | 3.4 | 126 | Tetragonal |
| No. 14 | 0.91 | 0.05 | 0.51  | 0.45  | 0.03 | 0.01 | 0.96 | 4.1 | 149 | Tetragonal |
| No. 15 | 0.91 | 0.05 | 0.5   | 0.45  | 0.03 | 0.02 | 0.96 | 5.7 | 170 | Tetragonal |

FIG. 1 shows the densities of the Samples No. 4 and No. 8, as representatives of the present invention, and the Samples No. 1, No. 10 and No. 12, as representatives of the comparative samples. These samples were produced by firing at a temperature ranging from 1200° to 1290° C. for 2 hours. In this figure, the abscissa represents the firing temperature and the ordinate represents the density of the fired composition.

FIG. 2 shows the density of the Sample No. 4, as a representative of the present invention, and the Sample No. 13, as a representative of the comparative samples. These samples were produced by firing at a temperature ranging from 1140° to 1350° C. for 2 hours. In this figure, the abscissa represents the firing temperature and the ordinate represents the density of the fired composition.

As seen from the above Table 1, the samples in which (a+b)/(c+d +e+f) was more than 1 and the crystal structure was tetragonal, had properties of an average crystal grain size of less than 3 $\mu$m and a piezoelectric constant $-d_{31}$ of more than 140 pm/V.

Incidentally, the mechanical quality factor $Q_m$ was excellent and not less than 500 in all the samples.

As can be seen in FIG. 1, Sample Nos. 4 and 8 of the present invention where (a+b)/(c+d+e+f) was more than 1

The obtained sintered body was ground in its inner surface, sliced and lapped to form rings having an outer diameter of 60 mm, an inner diameter of 45 mm and a thickness of 0.5 mm. From the rings, test pieces having a length of 15 mm were cut out for a flexural strength test.

The composition as shown for Sample No. 12 was prepared, which was shaped, fired and cut into test pieces in the similar manner as above except that the firing temperature was 1290° C. for 2 hours.

Fifteen of these samples (n=15) were subjected to a three point flexural strength test with the span between supports being 10 mm.

As a result, Sample No. 4 of the present invention had an average three point flexural strength of 131 MPa and comparative Sample No. 8 had an average three point flexural strength of 127 MPa, both of which are above 100 MPa, preferable for a ultrasonic wave motor.

Thus, it is demonstrated that the piezoelectric ceramic composition of the present invention has an initial strength equivalent to that of the conventional composition.

In the above Examples, it was confirmed that $ZrO_2$ was not deposited in the grain boundaries of the resultant ceramic compositions. It is therefore considered that the obtained ceramic compositions of the present invention has a higher fatigue resistance due to a smaller crystal grain size and absence of $ZrO_2$ deposit in the crystal grain boundaries.

What is claimed is:

1. An ultrasonic wave motor comprsing a piezoelectric ceramic composition having a tetragonal perovskite structure comprising an A site and a B site, represented by a general formula $(Pb_aSr_b)(Zr_cTi_dSb_eMn_f)O_3$, wherein Pb and Sr occupy the A site, Zr, Ti, Sb and Mn occupy the B site, and a molar ratio of A site/B site atoms of (a+b/c+d+e+f) is more than 1.00 and less than or equal to 1.03, wherein the values of a–f are the ratios of respective atoms when c+d+e+f=1.

2. The ultrasonic wave motor according to claim 1, wherein said molar ratio of A site/B site atoms is in a range of from 1.01 to 1.03.

3. The ultrasonic wave motor according to claim 1, wherein said piezoelectric ceramic composition has an average crystal particle size of 1 to 3 μm and an average flexural strength of not less than 100 MPa.

4. The ultrasonic wave motor according to claim 2, wherein said piezoelectric ceramic composition has an average crystal particle size of 1 to 3 μm and an average flexural strength of not less than 100 MPa.

5. The ultrasonic wave motor according to claim 1, wherein said piezoelectric ceramic composition has a piezoelectric constant, $-d_{31}$, of not less than 140 pm/V and a mechanical quality, $Q_m$, of not less than 500.

6. The ultrasonic wave motor according to claim 2, wherein said piezoelectric ceramic composition has a piezoelectric constant, $-d_{31}$, of not less than 140 pm/V and a mechanical quality, $Q_m$, of not less than 500.

7. The ultrasonic wave motor according to claim 3, wherein said piezoelectric ceramic composition has a piezoelectric constant, $-d_{31}$, of not less than 140 pm/V and a mechanical quality, $Q_m$, of not less than 500.

8. The ultrasonic wave motor according to claim 1, wherein in said molar ratio $c+d \geq 0.92$, $0.45 \leq c \leq 0.55$ and $0.45 \leq d \leq 0.55$.

9. The ultrasonic wave motor according to claim 1, wherein in said molar ratio $0.005 \leq e \leq 0.05$.

10. The ultrasonic wave motor according to claim 1, wherein in said molar ratio $0.005 \leq f \leq 0.03$.

11. The ultrasonic wave motor according to claim 1, wherein in said molar ratio $b \leq 0.1$.

12. The ultrasonic wave motor according to claim 11, wherein in said molar ratio $b \leq 0.3$.

* * * * *